US006784739B2

(12) United States Patent
Reffay et al.

(10) Patent No.: US 6,784,739 B2
(45) Date of Patent: Aug. 31, 2004

(54) CLASS AB AMPLIFIER CIRCUIT

(75) Inventors: Marius Reffay, Grenoble (FR); Michel Barou, Voreppe (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/245,842

(22) Filed: Sep. 17, 2002

(65) Prior Publication Data

US 2003/0071687 A1 Apr. 17, 2003

(51) Int. Cl.[7] ............................................. H03F 3/18
(52) U.S. Cl. ................................. 330/264; 330/267
(58) Field of Search ............................. 330/264, 267, 330/269, 273

(56) References Cited

U.S. PATENT DOCUMENTS 4,345,502 A * 8/1982 Jahns ........................... 84/723
4,743,860 A * 5/1988 Dziagwa ..................... 330/251
4,797,630 A * 1/1989 Brown ........................ 330/264
6,046,634 A   4/2000 Makino ..................... 330/146

FOREIGN PATENT DOCUMENTS

| DE | 3925342  | 2/1991  | ........... H03F/3/185 |
| EP | 0317015  | 9/1992  | ............ H03F/3/30 |
| JP | 55162610 | 12/1980 | ............ H03F/3/30 |

\* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

A class AB amplifier circuit includes a complementary output stage and a biasing circuit for biasing the output stage. The complementary output stage includes a P-type MOS transistor and an N-type MOS transistor, and the biasing circuit includes a bipolar transistor. The emitter and collector of the bipolar transistor are respectively connected to the gates of the P-type and N-type MOS transistors. The bipolar transistor is biased for controlling a bias voltage between the respective gates of the P-type and N-type MOS transistors.

30 Claims, 4 Drawing Sheets

CLASS AB AMPLIFIER CIRCUIT

FIELD OF THE INVENTION

The present invention relates to the field of high-voltage and high-frequency video amplifiers used in BCD (Bipolar/CMOS/DMOS) technology, and in particular, to a class AB amplifier used in CRT (cathode ray tube) screens, computer monitor screens and HDTV (high definition television) screens.

BACKGROUND OF THE INVENTION

The diagram of FIG. 1 illustrates the principle of a class AB amplifier. The amplifier comprises an output stage 10, which in this case is a complementary stage. Such a stage 10 includes a transistor MP1 and a transistor MN2 connected in series between a high voltage terminal 1 and a low voltage terminal 2. These transistors are respectively MOS transistors (metal-oxide semiconductor) of the P-type and of the N-type. The sources of the transistors MP1 and MN1 are connected together, and are connected to the output node OUT which delivers an output signal $V_{out}$. The drain of the transistor MP1 is connected to the terminal 2, and the drain of the transistor MN1 is connected to the terminal 1. The transistors MP1 and MN2 operate in a voltage follower mode.

Furthermore, the amplifier comprises control means 20. The control means 20 includes output nodes A1 and A2 which are respectively connected to the control gate of the transistor MP1 and to the control gate of the transistor MN2.

In a class AB amplifier, the transistors MP1 and MN2 of the output stage 10 are biased so that they are in a zone of operation close to conduction. This reduces the cross-over distortion of the output signal $V_{out}$. Biasing the transistors MP1 and MN2 includes creating a bias voltage $V_g$ between the control gates of these transistors. The result of this is that, in a static mode, a quiescent current IQ flows in the output stage 10. The bias voltage $V_g$ is defined by $\overline{Vg} = \overline{VGSP} + \overline{VGSN}$, where $\overline{VGSP}$ and $\overline{VGSN}$ are respectively the conduction voltages (gate-source voltages) of the transistors MP1 and MN2 for a conduction current having a value equal to the value of the desired quiescent current IQ. The quiescent current IQ in the output stage 10 (also called output quiescent current of the amplifier) must be accurately controlled.

To control the quiescent current IQ in the output stage 10, the control means 20 comprises a floating voltage source 21 connected between the nodes A1 and A2. This voltage source 21 generates a positive floating voltage $V_g$ between the gate of the transistor MN2 and that of the gate transistor MP1.

In the static mode, a current $I_{in}$ flows in the floating voltage source 21. This is a quiescent current of the control means 20, and is also called the input quiescent current of the amplifier, as opposed to the output quiescent current IQ. In a dynamic mode, a current $I_v$ is taken from the output node A1, or a current is injected into the output node A2. Such a current makes it possible to control the voltage on the input of the voltage follower that includes the output stage 10, and therefore the output signal $V_{out}$ as a function of an input signal to be amplified.

To reduce the effect of dispersion in component characteristics, which is inherent in silicon integration, the voltage $V_g$ is generally generated from components identical to the transistors MP1 and MN2 of the output stage 10. One embodiment of the voltage source 21 according to the prior art is illustrated by the circuit diagram of FIG. 2.

The voltage source 21 comprises two transistors MP3 and MN4 between the output nodes A1 and A2 of the control means 20, that is, between the respective control gates of the transistors MP1 and MN2. Each transistor is configured as a diode, and the two transistors MP3 and MN4 are connected in series to each other by their respective sources. The two transistors MP3 and MN4 are respectively MOS transistors of the P-type and of the N-type, and are respectively identical to the transistors MP1 and MN2. The control gates of each of the transistors MP3 and MN4 are connected, respectively, to the control gate of the transistor MP1 and to the control gate of the transistor MN4. Configuring transistors MP3 and MN4 as a diode is understood to mean that their drain is connected to their control gate.

The transistors MP3 and MN4 are respectively identical to the transistors MP1 and MN2. Like them, they therefore have a relatively large size. That is, their channel width is relatively large because the transistors MP1 and MN2 must produce a relatively large output current. This known structure therefore has the drawback of introducing a parasitic capacitance on the control gate of the transistor MN2 of the output stage 10. This is the parasitic capacitance denoted $C_p$ in FIG. 2, which exists between the drain of the transistor MN4 and the substrate (the latter conventionally being connected to ground). This parasitic capacitance $C_p$ penalizes this structure in the high-frequency range. This structure is therefore not very suitable for the type of applications planned.

To overcome this drawback, a structure of the type shown in FIG. 3 has already been proposed. This known structure is described in European Patent Application No. 317,015. According to this prior art, the voltage source 21' comprising a MOS transistor is connected between the output nodes A1 and A2 of the control means 20', that is, between the respective control gates of the transistors MP1 and MN2. In the example shown in FIG. 3, the MOS transistor is an N-type transistor referenced MN7. In other words, the resistor RD and the transistor MN7 are connected in series between the node B and the node A1.

In addition, the circuit comprises a branch connected in parallel with the branch including the resistor RD and the transistor MN7, between the node B and the node A1. This branch comprises two transistors MN5 and MP6, each one mounted as a diode, which are connected in series by their respective drains between the node B and the node A1. These transistors are MOS transistors of the N-type and of the P-type, respectively. The source of the transistor MN5 is connected to the node A1, and the source of the transistor MP6 is connected to the node B. The control gates of the transistors MP5 and MN6 are connected together. Furthermore, they are connected to the control gate of the transistor MN7.

The transistors MN5 and MP6 may be a much smaller size than the transistors MP1 and MN2. The voltage drop imposed in the resistor RD makes it possible to define the floating voltage $V_g$ between the output nodes A1 and A2 of the control means.

Nevertheless, this structure requires a stable input quiescent current $I_{in}$. To obtain this current $I_{in}$, it is advantageous to produce a current source with a single resistor whose value is relatively high and which is connected, for example, between the terminal 1 and the output node A2. The value of this resistor is on the order of 3 to 5 kΩ (kilohms). The transistor MN7 must then have a relatively large size (channel width). This is because, with a 3 kΩ resistor, it is necessary to generate a variation $\Delta I_v$ in the current $I_v$ of 15 mA (milliamps) to obtain a variation of the signal on the output OUT equal to 45 V (volts). The large size of the transistor MN7, which implies the existence of a relatively high parasitic capacitance on its drain, also makes this structure not very suitable in the high-frequency range.

SUMMARY OF THE INVENTION

In view of the foregoing background, an object of the present invention is to provide a class AB amplifier circuit overcoming the drawbacks of the prior art.

This and other objects, advantages and features in accordance with the present invention are provided by a class AB amplifier circuit comprising a complementary output stage that includes a P-type MOS transistor and an N-type MOS transistor connected in series between a first high-voltage terminal and a low voltage terminal.

The class AB amplifier circuit also comprises control means for biasing the output stage. The control means may comprise a bipolar transistor, the emitter and the collector of which are respectively connected to the control gates of the MOS transistors of the output stage. The bipolar transistor is biased so as to control a bias voltage between the respective control gates of the MOS transistors of the output stage.

The floating voltage source 21 of the circuit diagram of FIG. 1 is produced using a bipolar transistor. The good transconductance of a bipolar transistor, compared to that of a MOS transistor, avoids the drawback mentioned above in relation to the structure of FIG. 4. The current source 22 may then advantageously be produced using a simple resistor having a relatively low value, such as on the order of 3 to 5 kΩ.

DETAILED DESCRIPTION OF THE PREFERRED EMBODIMENTS

Figure 1:
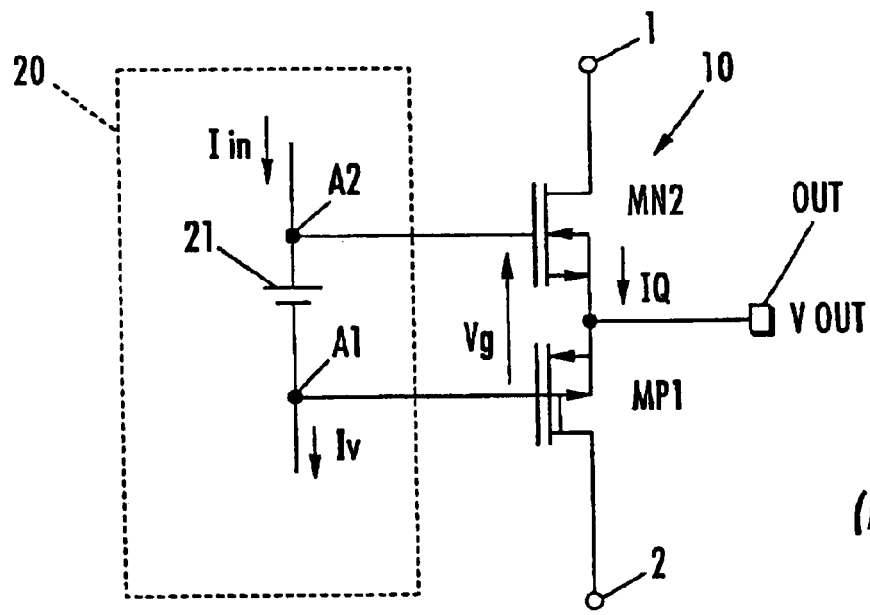
FIG. 1 is a schematic diagram illustrating the principle of a class AB amplifier in accordance with the prior art.
Figure 2:
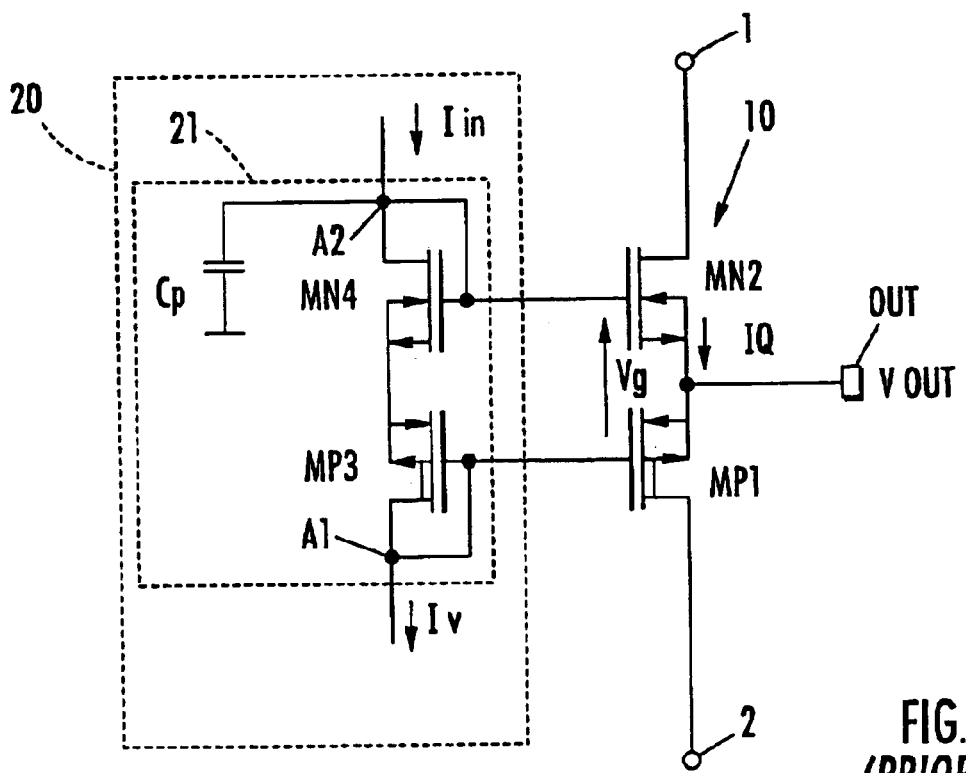
FIG. 2 is a schematic diagram illustrating one approach for biasing the output stage illustrated in FIG. 1.
Figure 3:
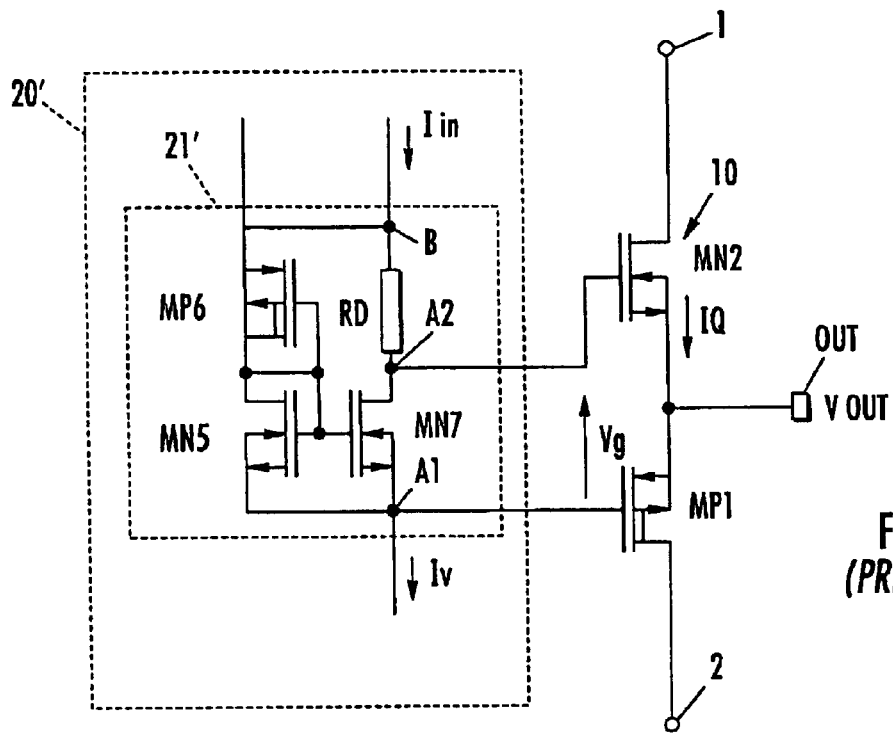
FIG. 3 is a schematic diagram illustrating another approach for biasing the output stage illustrated in FIG. 1.
Figure 4:
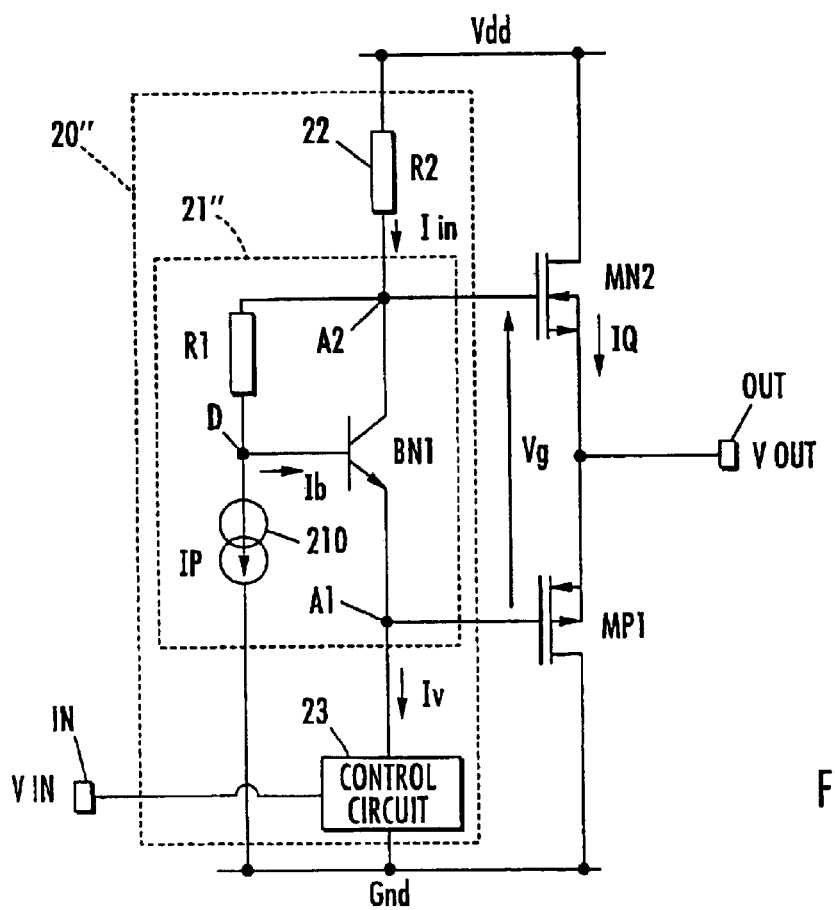
FIG. 4 is a schematic diagram illustrating one approach in accordance with the present invention for biasing the output stage illustrated in FIG. 1.

FIG. 4 is the diagram of an amplifier circuit according to one embodiment of the invention. It is a class AB amplifier circuit comprising a complementary output stage 10 and control means 20".

The output stage 10 comprises a transistor MP1 and a transistor MP2 connected in series between a first high voltage terminal and a low voltage terminal. In the example, the first high voltage terminal is a terminal $V_{dd}$ with a high-voltage positive supply (for example, $V_{dd}$=+100 V). The low voltage terminal may be a negative voltage terminal, but in the example it is ground Gnd.

The transistor MP1 is a P-type MOS transistor and the transistor MN2 is an N-type MOS transistor. The drain of the transistor MP1 is connected to the terminal Gnd, and the drain of the transistor MN2 is connected to the terminal $V_{dd}$. The respective sources of the transistors MP1 and MN2 are connected together, and are connected to an output node OUT to deliver an output signal $V_{out}$. Their respective control gates are connected, respectively, to the output node A1 and to the output node A2 of the control means 20.

In one example embodiment of the invention, the amplifier is made using BCD technology. In this example, the transistors MP1 and MN2 are transistors using DMOS (double-diffused MOS) technology. According to this technology, the channel length is established by two sequential diffusions through the same opening. When the second diffusion takes place, the first diffusion zone moves laterally towards the sides. The second diffusion zone acts as a source electrode, the substrate acts as a drain electrode, and the zone between the two diffusion zones acts as a gate electrode. This technology makes it possible to obtain a narrow gate, whose width is well controlled.

Furthermore, DMOS transistors are particularly suitable for producing high-voltage circuits, since they have less risk of breakdown of the gate oxide layer when they are used at high voltages. However, this is only one example, and it is possible for the amplifier to be just as easily made using BiCMOS (Bipolar Complementary MOS) technology.

The control means 20" comprises means 21" for biasing the output stage 10. The function of the means 21" is to generate a bias voltage $V_g$ between the output nodes A1 and A2 of the control means 20". This bias voltage is thus applied between the respective control gates of the transistors MP1 and MN2.

The biasing means 21" comprises a bipolar transistor BN1, the emitter and the collector of which are connected to the respective control gates of the MOS transistors of the output stage. In the example shown, the transistor BN1 is an NPN transistor. Its emitter is connected to the control gate of the transistor MP1, and its collector is connected to the control gate of the transistor MN2.

The transistor BN1 is biased so that its collector-emitter voltage controls the bias voltage $V_g$ between the respective control gates of the transistors MP1 and MN2. The biasing means 21" also comprises a resistor R1 connected between the base and the collector of the bipolar transistor BN1, and means 210 for causing a specific voltage drop $\overline{VR1}$ at the terminals of the resistor R1.

The means 210 functions as a current source for generating a specific current IP and for causing it to flow in the resistor R1. The current source 210 is connected between the node D, which is the common node between the resistor R1 and the base of the transistor BN1, and ground Gnd. By assuming that the current gain $h_{fe}$ of the transistor BN1 is infinite, it is possible to ignore the base current $I_b$ of the transistor BN1 compared to the current IP. This allows one to consider that only the current IP flows in the resistor R1.

To provide a correct bias of the output stage 10, that is, so that the quiescent current IQ in this stage has a desired specific value, the current IP must be given by the following relationship:

$$IP=(\overline{VGSP}+\overline{VGSN}-\overline{VBE})/R1 \quad (1)$$

$\overline{VGSP}$ and $\overline{VGSN}$ respectively denote the conduction voltage (gate-source voltage) of the transistors MP1 and MN2 of the output stage 10 for the desired value of the quiescent current IQ. $\overline{VBE}$ denotes the conduction voltage (base-emitter voltage) of the bipolar transistor BN1, and R1 denotes the resistance of the resistor R1.

Applying Kirchoff's law to the gate-source circuit of the transistors MP1 and MN2, the base-emitter circuit of the transistor BN1, and furthermore the resistor R1, gives:

$$\overline{VGSP} + \overline{VGSN} + \overline{VBE} + \overline{VR1} = 0 \quad (2)$$

It is thus possible to verify that the bias voltage $V_g$ is equal to the conduction voltage of the transistor MP1 plus the conduction voltage of the transistor MN2 for the desired value of the quiescent current IQ. In other words, $\overline{Vp} = \overline{VGSP} + \overline{VGSN}$. An exemplary embodiment of the current source 210, which makes it possible to obtain the value of the current IP given by relationship (1) above, will be discussed below with reference to FIG. 6.

The control means 20" furthermore comprise a current source 22, making it possible to generate an input quiescent current. In this case, the current source 22 includes a resistor R2 with a relatively high resistance, which is placed between the terminal $V_{dd}$ and one of the terminals of the resistor R1 which is not connected to the base of the bipolar transistor BN1. In this case, it is the terminal of the resistor R1 that is connected to the collector of the transistor BN1.

Figure 6:
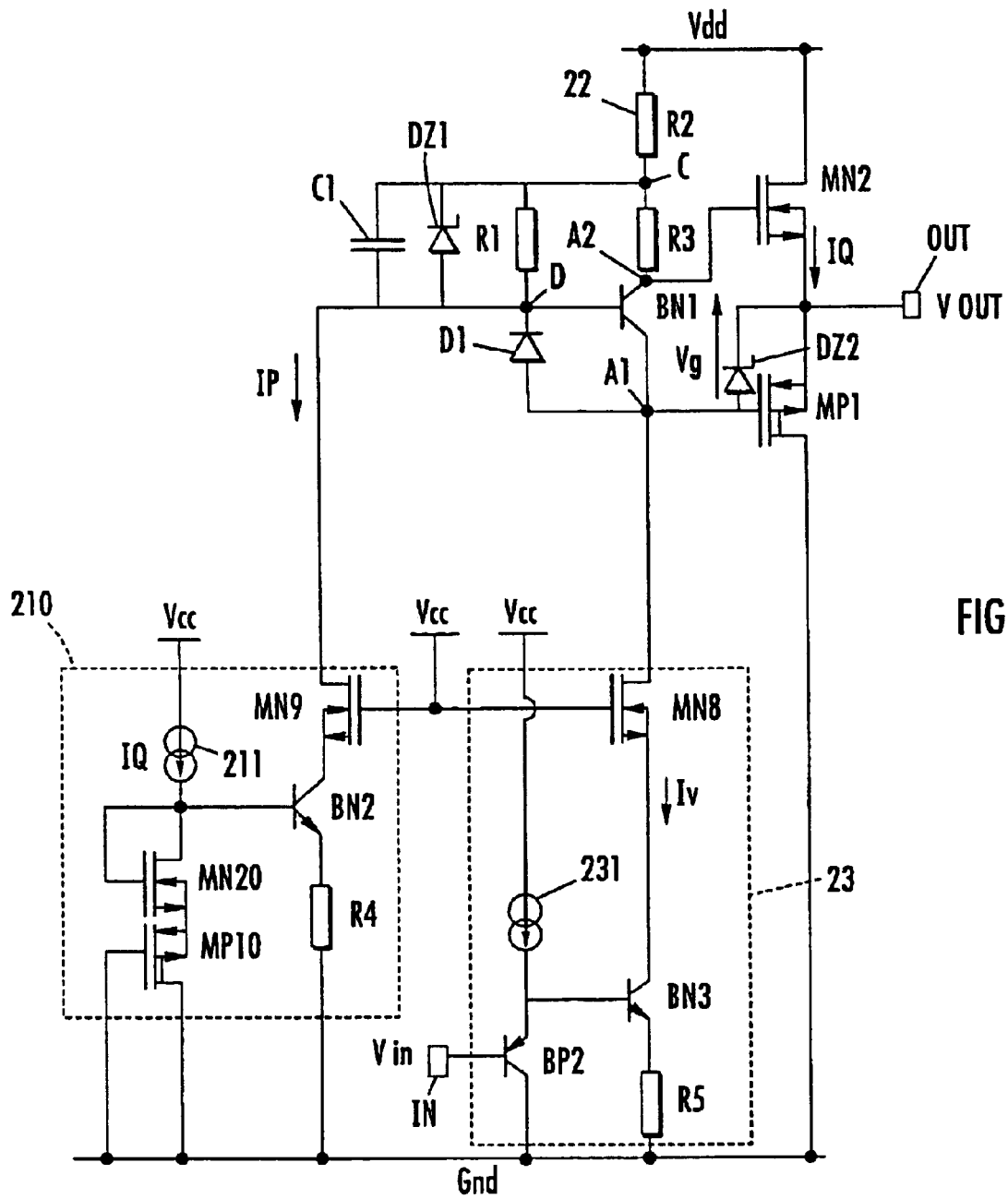
FIG. 6 is a schematic diagram illustrating application of a class AB amplifier in accordance with the present invention to a high-voltage video amplifier.

The control means 20" furthermore comprises dynamic control means 23 for generating a current $I_v$ from an input signal $V_{in}$ to be amplified. The signal $V_{in}$ is supplied to the means 23 via an input terminal IN of the amplifier. In the example shown, the current $I_v$ is taken to ground Gnd from the output node A2 of the control means, that is, from the control gate of the transistor MP1. In this way, the means 23 may be produced from components operating at low voltage. One embodiment of the means 23 will be detailed below within the scope of the example embodying the invention, which is illustrated in FIG. 6.

Figure 5:
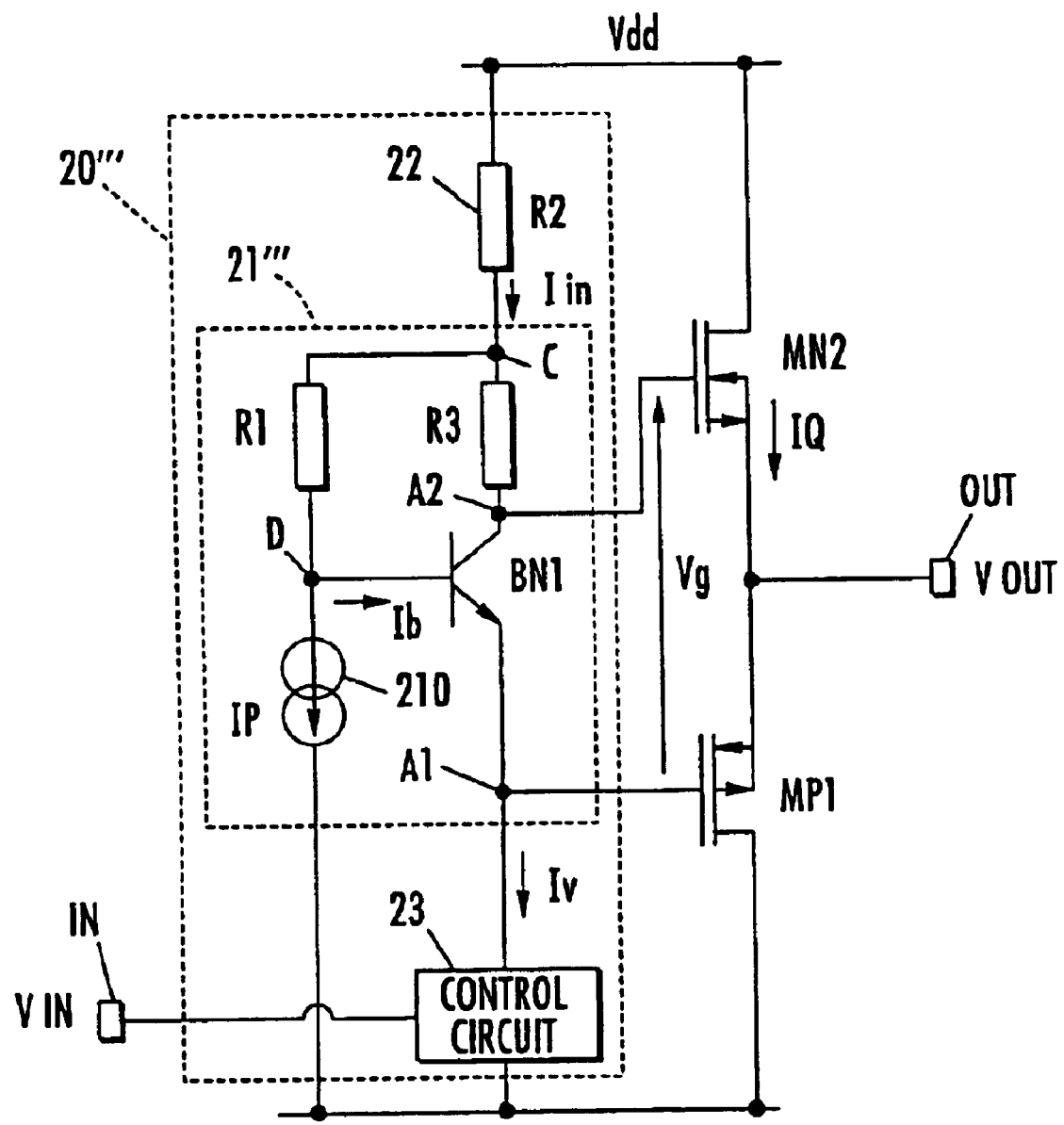
FIG. 5 is a schematic diagram illustrating another approach in accordance with the present invention for biasing the output stage illustrated in FIG. 1.

In another embodiment, shown schematically in FIG. 5, the means for biasing the output stage furthermore comprises a second resistor R3, which is placed in series with the resistor R1. More specifically, one terminal of the resistor R1 is connected to the base of the bipolar transistor BN1, one terminal of the resistor R3 is connected to the collector of the bipolar transistor BN1, and the two other respective terminals of the resistor R1 and of the second resistor R3 are connected together at a common node C. Once connected, the current $I_v$ flows through the resistor R3 while the current IP always flows through the resistor R1.

The relationship (2) above is thus modified as follows:

$$\overline{VGSP} + \overline{VGSN} + \overline{VBE} + \overline{VR1} + \overline{VR3} = 0 \quad (3)$$

where $\overline{VR3}$ denotes the voltage drop at the terminals of the resistor R3.

The function of the resistor R3 is to compensate for the effects linked to the fact that the current gain of the bipolar transistor BN1, conventionally denoted $h_{fe}$, is not infinite. Typically, $h_{fe}$ is equal to one hundred or a few hundred (for example, $h_{fe}$=100 or 200).

For purposes of discussion, it is assumed that the current $I_v$ increases by a value $\Delta I_v$ following an increase $\Delta V_{in}$ of the input signal $V_{in}$. Since the current $I_v$ is the collector current of the transistor BN1, the base current $I_b$ of the transistor BN1 increases as a consequence (since the gain $h_{fe}$ is not infinite). Therefore, the current which flows through the resistor R1, which is strictly equal to the current IP plus the base current $I_b$ of the transistor BN1, also increases by a value $\Delta I_v/h_{fe}$. Consequently, the voltage drop at the terminals of the resistor R1 increases by a value $\Delta I_v \times R1/h_{fe}$. With a circuit according to the diagram of FIG. 4, this slightly modifies the bias voltage $V_g$ of the output stage 10.

Nevertheless, with a circuit according to the variation of FIG. 5, the current $I_v$ also flows through the resistor R3. In this way, the increase $\Delta I_v$ of the current $I_v$ produces an increase in the voltage drop $\overline{VR3}$ at the terminals of the resistor R3, which is equal to R3×$\Delta I_v$. This is why the value of the resistor R3 is chosen to be substantially equal to the value of the resistor R1 divided by the current gain $h_{fe}$ of the bipolar transistor BN1 (R3≅R1/$h_{fe}$). In this case, the voltage drop at the terminals of R3 on the collector side of BN1 compensates for the voltage drop at the terminals of R1 on the emitter side of BN1, so that the bias voltage $V_g$ is not sensitive to the variations of the current $I_v$ which result from the variations of the input signal $V_{in}$.

It will be noted that the voltage $\overline{VBE}$ of the transistor BN1 also varies slightly when the current $I_v$ varies. This also makes the value of the voltage $V_g$ vary, and therefore affects the bias. Nevertheless, this variation in the voltage $\overline{VBE}$ is very slight, and can be ignored.

In the exemplary embodiment of FIG. 4 and in the variation of FIG. 5, the bipolar transistor BN1 is an NPN transistor. Nevertheless, a person skilled in the art will appreciate that this transistor could just as well be a PNP transistor. The emitter and the collector of the PNP transistor would be connected respectively to the output node A2 and to the output node A1 of the control means 20" of 20'''.

In this case, the current source 210 would be connected between the high-voltage terminal $V_{dd}$ and the base of the bipolar transistor. This is why the choice of an NPN bipolar transistor, such as the transistor BN1 shown in FIG. 4 and in FIG. 5, is preferable. This allows the current source 210 to be formed using components operating at low voltage.

FIG. 6 shows an illustration of an example of applying a circuit according to the invention to the generation of a high-voltage video signal. In this figure, means of producing the current source 210 are detailed according to a possible embodiment. This will be the same for the means 23. In this example, the high voltage supply is at high voltage, for example +100 V.

The means 210, which makes it possible to generate the current IP, comprises a first branch to generate a voltage equal to the voltage $\overline{VGSP} + \overline{VGSN}$ of the relationships (1) and (2) given above. The first branch comprises the following elements, placed in series between another voltage terminal $V_{cc}$ delivering a low positive supply voltage (for example +12 V) and ground Gnd.

The first branch comprises a transistor MP10 and a transistor MN20 in series, which are respectively MOS transistors of the P-type and of the N-type. They are respectively identical to the transistors MP1 and MN2 of the output stage 10. Furthermore, they are each mounted as a diode. That is, they are connected by their respective sources, and the drain of the transistor MP10 is connected to ground Gnd. A current source 211 delivers a specific current, the value of which is equal to the value desired for the quiescent current IQ in the output stage 10. This current source 211 is connected between the terminal $V_{cc}$ and the drain of the transistor MN20.

The above mentioned voltage $\overline{VGSP} + \overline{VGSN}$ is available on the drain of the transistor MN20. Furthermore, the means 210 comprises a second branch including a bipolar transistor BN2 of the NPN type. The emitter of this transistor is connected to ground Gnd, the base is connected to the drain of the transistor MN20 in order to receive the voltage $\overline{VGSP} + \overline{VGSN}$, and the collector is connected to the base of the transistor BN1 (node D) of the biasing means 21" or 21''' via a cascode transistor MN9. Transistor MN9 is an N-type MOS transistor, the control gate of which is connected to the terminal $V_{cc}$ in order to receive the low supply voltage.

In this way, the current which flows in this branch through the cascode transistor MN9 has a value equal to $(\overline{VGSP}+\overline{VGSN}\,\overline{VBE})/R4$. Once the value of the resistor R4 is equal to that of the resistor R1, it is possible to verify that this value is equal to the value of the current IP defined by the relationship (1) given above. This is why the resistor R4 and the resistor R1 have the same value.

As for the means 23, it also comprises a first branch and a second branch. The first branch comprises a bipolar transistor BP2, which is a PNP transistor. The base of this transistor is connected to the input terminal IN to receive the signal $V_{in}$ to be amplified, the collector is connected to ground Gnd, and the emitter is connected to the terminal $V_{cc}$ via a current source 231.

The second branch comprises a bipolar transistor BN3, which is an NPN transistor. The base of this transistor is connected to the emitter of the transistor BP2 of the first branch, the emitter is connected to ground Gnd via a resistor R5, and the collector is connected to the output node A1 of the control means 20" or 20'" (that is, to the gate of the transistor MP1 of the output stage) via a second cascode transistor MN8. Transistor MN8 is an N-type MOS transistor, the control gate of which is connected to the terminal $V_{cc}$ to receive the low positive supply voltage.

Thus, the voltage $V_{in}$ is on the emitter of the transistor BN3 since the voltages $\overline{VBE}$ of the transistors BP2 and BN3 compensate for each other. Consequently, the current which flows in the second branch, which is the current $I_v$, is equal to $V_{in}/R5$. It can therefore be verified that the means 23 generates a current $I_v$ which is a direct function of the input signal $V_{in}$. This current $I_v$ is taken from the node A1 to ground.

The function of the cascode transistors MN8 and MN9 is to separate properly the parts of the circuit operating at high voltage (the high positive supply voltage $V_{dd}$) from those operating at low voltage (the low positive supply voltage $V_{cc}$). Below the transistors MN8 and MN9, the voltage level may vary from 0 to +12 V with respect to ground. Above these transistors, it may vary from +12 to +100 V.

In the application example, the signal $V_{in}$ is a video signal, and the signal $V_{out}$ is a high-voltage video signal. The output node OUT is connected to a load which is typically a cathode tube of a screen. Such a load is mainly capacitive in nature, and may therefore generate over voltages. In order to protect the bipolar transistor BN1 against these possible over voltages, a capacitor C1 and a Zener diode DZ1 are connected in parallel with the resistor R1. The cathode of this Zener diode is connected to the base of the transistor BN1. Similarly, to protect the transistor MP1, a Zener diode DZ2 is connected to the source of this transistor by its cathode, and to the control gate of this transistor by its anode.

In a dynamic mode, the circuit operates as follows. A variation $\Delta V_{in}$ in the signal $V_{in}$ causes a variation $\Delta I_v/R5$ in the current $I_v$. This variation causes a variation $\Delta I_v \times R2/R5$ at the terminals of the resistor R2. By neglecting the voltage drop at the terminals of the resistor R3 (when it is present), the value of which is low with respect to that of the resistor R2, this variation $\Delta I_v \times R2/R5$ is transmitted with a gain equal to unity by the output stage 10 which is a voltage follower. It follows that the output voltage $V_{out}$ is subject to a variation $\Delta I_v \times R2/R5$. In other words, the voltage gain of the amplifier is substantially equal to R2/R5. In one example, the following values are chosen: R2=4 k$\Omega$, R5=200$\Omega$ (ohms). The voltage gain of the amplifier is then equal to 20.

That which is claimed is:

1. A class AB amplifier circuit comprising:
    a complementary output stage comprising a P-type MOS transistor and an N-type MOS transistor connected in series between a first high-voltage reference and a low voltage reference, said P-type and N-type MOS transistors each having a gate;
    a bipolar transistor for controlling a bias voltage between the respective gates of said P-type and N-type MOS transistors; and
    bipolar transistor biasing means for biasing said bipolar transistor, and comprising
        a first resistor connected between a base and a collector of said bipolar transistor, and
        current means for causing a specific voltage drop across said first resistor.

2. A class AB amplifier circuit according to claim 1, wherein said bipolar transistor biasing means further comprises a second resistor connected in series with said first resistor; said first resistor having a first terminal connected to the base of said bipolar transistor, and a second terminal; said second resistor having a first terminal connected to the collector of said bipolar transistor, and a second terminal connected to the second terminal of said first resistor.

3. A class AB amplifier circuit according to claim 2, wherein a value of said second resistor is substantially equal to a value of said first resistor divided by a current gain of said bipolar transistor.

4. A class AB amplifier circuit according to claim 1, wherein said current means generates a current IP that conducts through said first resistor, with the current IP being defined by the following relationship:

$$IP=(\overline{VGSP}+\overline{VGSN}-\overline{VBE})/R1$$

$\overline{VGSP}$ and $\overline{VGSN}$ respectively represent a conduction voltage of said P-type MOS transistor and a conduction voltage of said N-type MOS transistor for a desired value of a quiescent current in said complementary output stage;
$\overline{VBE}$ represents a conduction voltage of said bipolar transistor; and
R1 represents a value of said first resistor.

5. A class AB amplifier circuit according to claim 4, wherein said current means comprises:
    a second P-type MOS transistor and a second N-type MOS transistor connected in series and respectively being identical to said P-type and N-type MOS transistors of said complimentary output stage, with each of said second P-type and N-type MOS transistors being configured as a diode; and
    a current source connected to at least one of said second P-type and N-type MOS transistors for providing a current having a value equal to the desired value of the quiescent current in said complimentary output stage for generating a voltage equal to $\overline{VGSP}+\overline{VGSN}$.

6. A class AB amplifier circuit according to claim 5, wherein said current source and said second P-type and N-type MOS transistors are connected in series between a second high voltage reference and the low voltage reference.

7. A class AB amplifier circuit according to claim 1, wherein said bipolar transistor comprises an NPN transistor.

8. A class AB amplifier circuit according to claim 1, further comprising a current source connected between the high voltage reference and a base of said bipolar transistor.

9. A class AB amplifier circuit according to claim 8, wherein said current source comprises a resistor.

10. A class AB amplifier circuit according to claim 1, further comprising control means connected to said complementary output stage and to said output stage biasing means, said control means having an input for receiving an input signal and generating a current therefrom to be amplified, with the current being taken to the low voltage reference from the gate of said P-type MOS transistor.

11. A class AB amplifier circuit according to claim 1, further comprising a current source connected between the high voltage reference and a base of said bipolar transistor.

12. A class AB amplifier circuit according to claim 11, wherein said current source comprises a resistor.

13. A class AB amplifier circuit comprising:
   an output stage comprising a P-type MOS transistor and an N-type MOS transistor connected in series between a first high-voltage reference and a low voltage reference, said P-type and N-type MOS transistors each having a gate;
   a bipolar transistor for controlling a bias voltage between the respective gates of said P-type and N-type MOS transistors, said bipolar transistor having an emitter connected to the gate of said P-type MOS transistor and a collector connected to the gate of said N-type MOS transistor; and
   a bipolar transistor biasing circuit for biasing said bipolar transistor, and comprising
      a first resistor connected between a base and the collector of said bipolar transistor, and
      a current generating circuit for causing a specific voltage drop across said first resistor.

14. A class AB amplifier circuit according to claim 13, wherein said bipolar transistor biasing circuit further comprises a second resistor connected in series with said first resistor; said first resistor having a first terminal connected to the base of said bipolar transistor, and a second terminal; said second resistor having a first terminal connected to the collector of said bipolar transistor, and a second terminal connected to the second terminal of said first resistor.

15. A class AB amplifier circuit according to claim 14, wherein a value of said second resistor is substantially equal to a value of said first resistor divided by a current gain of said bipolar transistor.

16. A class AB amplifier circuit according to claim 13, wherein said current generating circuit generates a current IP that conducts through said first resistor, with the current IP being defined by the following relationship:

$$IP=(\overline{VGSP}+\overline{VGSN}-\overline{VBE})/R1$$

$\overline{VGSP}$ and $\overline{VGSN}$ respectively represent a conduction voltage of said P-type MOS transistor and a conduction voltage of said N-type MOS transistor for a desired value of a quiescent current in said output stage;
$\overline{VBE}$ represents a conduction voltage of said bipolar transistor; and
R1 represents a value of said first resistor.

17. A class AB amplifier circuit according to claim 16, wherein said current generating circuit comprises:
   a second P-type MOS transistor and a second N-type MOS transistor connected in series, with each of said second P-type and N-type MOS transistors being configured as a diode; and
   a current source connected to at least one of said second P-type and N-type MOS transistors for providing a current having a value equal to the desired value of the quiescent current in said output stage for generating a voltage equal to $\overline{VGSP}+\overline{VGSN}$.

18. A class AB amplifier circuit according to claim 17, wherein said current source and said second P-type and N-type MOS transistors are connected in series between a second high voltage reference and the low voltage reference.

19. A class AB amplifier circuit according to claim 13, wherein said bipolar transistor comprises an NPN transistor.

20. A class AB amplifier circuit according to claim 13, further comprising a control circuit connected to said output stage and to said current generating circuit, said control circuit having an input for receiving an input signal and generating a current therefrom to be amplified.

21. A method for biasing a complementary output stage of a class AB amplifier circuit, the complementary output stage comprising a P-type MOS transistor and an N-type MOS transistor connected in series between a first high-voltage reference and a low voltage reference, the method comprising:
   controlling a bias voltage between respective gates of the P-type and N-type MOS transistors using a bipolar transistor having an emitter connected to the gate of the P-type MOS transistor and a collector connected to the gate of the N-type MOS transistor; and
   biasing the bipolar transistor using a bipolar transistor biasing circuit comprising a first resistor connected between a base and the collector of the bipolar transistor, and a current generating circuit for causing a specific voltage drop across the first resistor.

22. A method according to claim 21, wherein the bipolar transistor biasing circuit further comprises a second resistor connected in series with the first resistor; the first resistor having a first terminal connected to the base of the bipolar transistor, and a second terminal; the second resistor having a first terminal connected to the collector of the bipolar transistor, and a second terminal connected to the second terminal of said first resistor.

23. A method according to claim 22, wherein a value of the second resistor is substantially equal to a value of the first resistor divided by a current gain of the bipolar transistor.

24. A method according to claim 21, wherein the current generating circuit generates a current IP that conducts through the first resistor, with the current IP being defined by the following relationship:

$$IP=(\overline{VGSP}+\overline{VGSN}-\overline{VBE})/R1$$

$\overline{VGSP}$ and $\overline{VGSN}$ respectively represent a conduction voltage of the P-type MOS transistor and a conduction voltage of the N-type MOS transistor for a desired value of a quiescent current in the complimentary output stage;
$\overline{VBE}$ represents a conduction voltage of the bipolar transistor; and
R1 represents a value of the first resistor.

25. A method according to claim 24, wherein the current generating circuit comprises:
   a second P-type MOS transistor and a second N-type MOS transistor connected in series, with each of the second P-type and N-type MOS transistors being configured as a diode; and
   a current source connected to at least one of the second P-type and N-type MOS transistors for providing a current having a value equal to the desired value of the quiescent current in the complimentary output stage for generating a voltage equal to $\overline{VGSP}+\overline{VGSN}$.

26. A method according to claim 25, wherein the current source and the second P-type and N-type MOS transistors are connected in series between a second high voltage reference and the low voltage reference.

27. A method according to claim 21, wherein the bipolar transistor comprises an NPN transistor.

28. A method according to claim 21, wherein the amplifier further comprises a current source connected between the high voltage reference and a base of said bipolar transistor.

29. A method according to claim 28, wherein the current source comprises a resistor.

30. A method according to claim 21, wherein the amplifier further comprises a control circuit connected to the complementary output stage and to the current generating circuit, the control circuit having an input for receiving an input signal and generating a current therefrom to be amplified.

* * * * *

UNITED STATES PATENT AND TRADEMARK OFFICE
CERTIFICATE OF CORRECTION

PATENT NO. : 6,784,739 B2  
DATED : August 31, 2004  
INVENTOR(S) : Marius Reffay and Michel Barou It is certified that error appears in the above-identified patent and that said Letters Patent is hereby corrected as shown below:

<u>Title page,</u>  
Insert Item:  
-- [30]  Foreign Application Priority Data  
    Sept. 18, 2001 (FR) ...........0112050 --

Signed and Sealed this

First Day of March, 2005

JON W. DUDAS  
*Director of the United States Patent and Trademark Office*